United States Patent
Kubota (10) Patent No.: US 9,287,210 B2
(45) Date of Patent: Mar. 15, 2016

(54) SEMICONDUCTOR DEVICE HAVING A SWITCH THAT EXPANDS AND CONTRACTS BY TEMPERATURE CHANGE

(71) Applicant: FUJITSU LIMITED, Kawasaki-shi, Kanagawa (JP)

(72) Inventor: Hajime Kubota, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/561,751

(22) Filed: Dec. 5, 2014

(65) Prior Publication Data
US 2015/0200157 A1      Jul. 16, 2015

(30) Foreign Application Priority Data
Jan. 10, 2014   (JP) .................. 2014-002880

(51) Int. Cl.
| | |
|---|---|
| *H01L 23/12* | (2006.01) |
| *H01L 23/48* | (2006.01) |
| *H01L 23/52* | (2006.01) |
| *H01L 29/40* | (2006.01) |
| *H01L 23/525* | (2006.01) |
| *H01L 23/34* | (2006.01) |
| *H01L 25/065* | (2006.01) |
| *H01L 23/00* | (2006.01) |

(52) U.S. Cl.
CPC ............. *H01L 23/525* (2013.01); *H01L 23/345* (2013.01); *H01L 23/52* (2013.01); *H01L 24/16* (2013.01); *H01L 25/0655* (2013.01); *H01L 25/0657* (2013.01); *H01L 2224/0401* (2013.01); *H01L 2224/0557* (2013.01); *H01L 2224/16145* (2013.01); *H01L 2225/06513* (2013.01); *H01L 2225/06541* (2013.01); *H01L 2225/06589* (2013.01)

(58) Field of Classification Search
None
See application file for complete search history.

(56) References Cited

U.S. PATENT DOCUMENTS

| | | | | |
|---|---|---|---|---|
| 2010/0065263 A1* | 3/2010 | Tanchon | .................. | B64G 1/58 165/277 |
| 2014/0007915 A1* | 1/2014 | Koehne | .................. | H01L 35/28 136/205 |

FOREIGN PATENT DOCUMENTS

JP         07-085756 A       3/1995

* cited by examiner

*Primary Examiner* — Evan Pert
*Assistant Examiner* — Shaka White
(74) *Attorney, Agent, or Firm* — Squire Patton Boggs (US) LLP (57) ABSTRACT

A semiconductor device includes: a first semiconductor-chip including a first electrode; a second semiconductor-chip including a second electrode; and a switch including a core element configured to contract and expand by a temperature change, a heat generation unit configured to heat the core element, a first metal element configured to cover the core element and connected to the first electrode, and a second metal element configured to cover the core element and connected to the second electrode, wherein, when the core element contracts, the first metal element and the second metal element come in contact with each other so that the first semiconductor-chip and the second semiconductor-chip are electrically connected with each other, and when the core element expands, the first metal element and the second metal element become in non-contact with each other so that the first semiconductor-chip and the second semiconductor-chip are electrically separated from each other.

6 Claims, 10 Drawing Sheets

SEMICONDUCTOR DEVICE HAVING A SWITCH THAT EXPANDS AND CONTRACTS BY TEMPERATURE CHANGE

CROSS-REFERENCE TO RELATED APPLICATION

This application is based upon and claims the benefit of priority from the prior Japanese Patent Application No. 2014-002880 filed on Jan. 10, 2014, the entire contents of which are incorporated herein by reference.

FIELD

Exemplary embodiments discussed herein are related to a semiconductor device.

BACKGROUND

As the information processing devices are miniaturized and the processing speed thereof is improved, semiconductor devices are required to be miniaturized as well. A laminated semiconductor chip is known as a semiconductor chip which meets the miniaturization request of semiconductor devices. Since the laminated semiconductor chip has a three-dimensional structure, an effective mounting density may be improved while suppressing enlargement of a mounting area. In addition, since a wiring that interconnects laminated semiconductor chips is becoming shortened, the laminated semiconductor chip also contributes to enhancement of operation speed and reduction of power consumption.

Related techniques are disclosed in, for example, Japanese Laid-Open Patent Publication No. H07-085756.

SUMMARY

The object and advantages of the invention will be realized and attained by means of the elements and combinations particularly pointed out in the claims. It is to be understood that both the foregoing general description and the following detailed description are exemplary and explanatory and are not restrictive of the invention, as claimed.

Laminated semiconductor chips are electrically interconnected using a through silicon via (TSV). It is requested that electrical connection and separation between semiconductor chips are selectively performed. The present disclosure provides a technology of selectively performing electrical connection and separation between semiconductor chips.

A semiconductor device according to an aspect of the present disclosure includes: a first semiconductor chip including a first electrode; a second semiconductor chip including a second electrode; and a switch including a core element which contracts and expands by a temperature change, a heat generation unit which heats the core element, a first metal element which covers the core element and is connected to the first electrode, and a second metal element which covers the core element and is connected to the second electrode. When the core element contracts, the first metal element and the second metal element come in contact with each other so that the first semiconductor chip and the second semiconductor chip are electrically connected with each other. When the core element expands, the first metal element and the second metal element become in non-contact with each other so that the first semiconductor chip and the second semiconductor chip are electrically separated from each other.

DESCRIPTION OF EMBODIMENTS

Hereinafter, exemplary embodiments will be described with reference to the accompanying drawings. Configurations of the exemplary embodiments are illustrative only, and the configuration of a semiconductor device of the present disclosure is not limited to the exemplary embodiments. When implementing the configuration of the semiconductor device of the present disclosure, specific configurations according to the exemplary embodiments may be properly employed.

Figure 1:
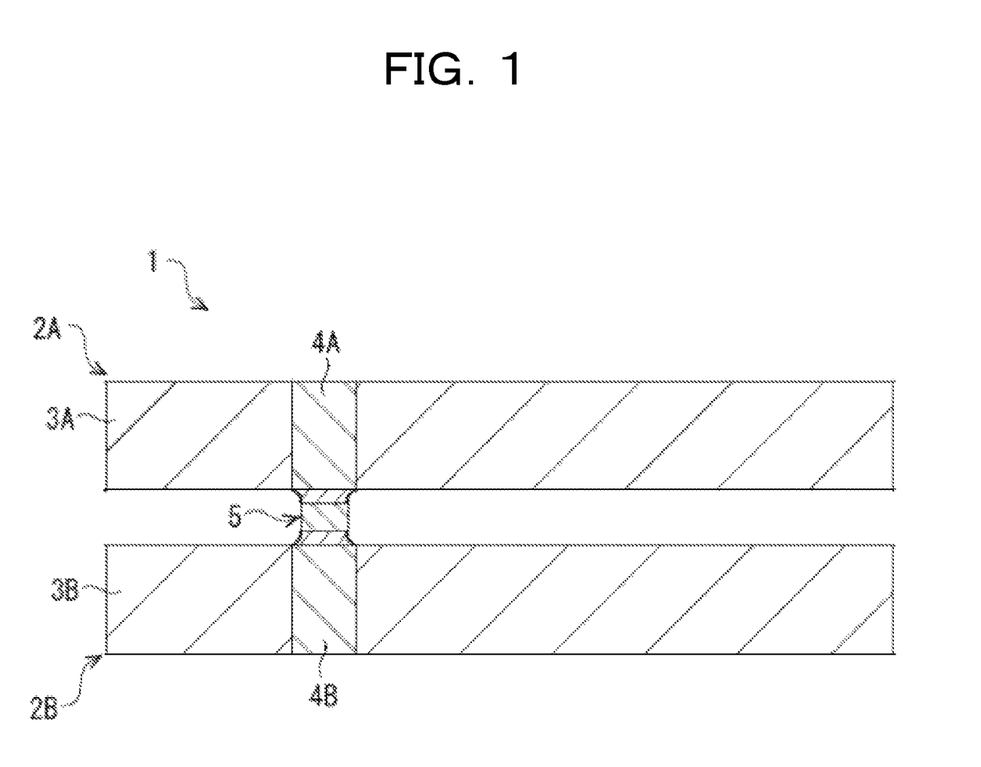
FIG. 1 is a view illustrating a configuration of a semiconductor device.

FIG. 1 is a view illustrating a configuration of a semiconductor device 1. The semiconductor device 1 is provided with a plurality of laminated semiconductor chips 2. Although FIG. 1 illustrates two layers of semiconductor chips 2A and 2B, the number of laminated semiconductor chips 2 is not limited to the example illustrated in FIG. 1. The semiconductor chip 2A includes a semiconductor substrate 3A, and a through electrode 4A provided in the semiconductor substrate 3A. The semiconductor chip 2B includes a semiconductor substrate 3B, and a through electrode 4B provided in the semiconductor substrate 3B. The semiconductor chip 2A is an example of a first semiconductor chip. The semiconductor chip 2B is an example of a second semiconductor chip. The through electrode 4A is an example of a first electrode. The through electrode 4B is an example of a second electrode.

Figure 2A:
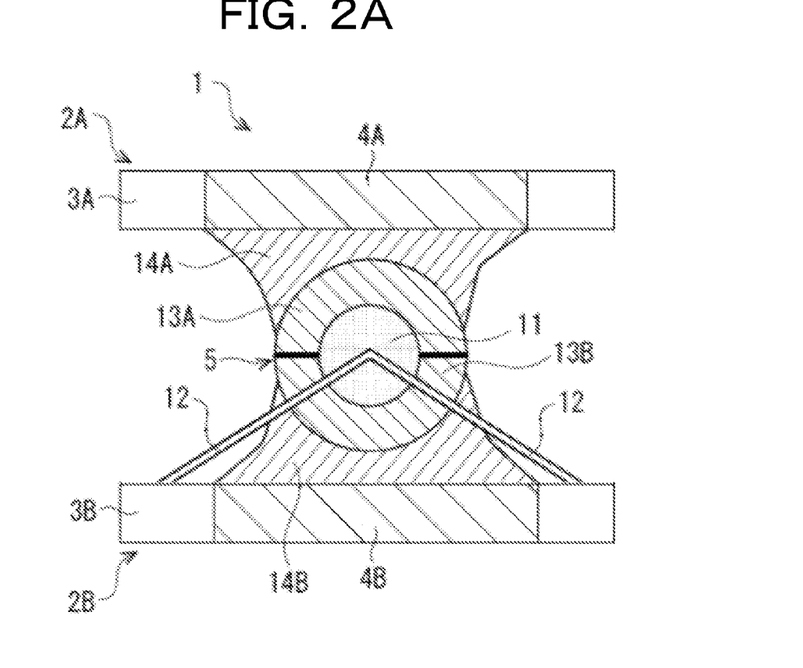
FIG. 2A is a cross-sectional view illustrating an exemplary switch.
Figure 2B:
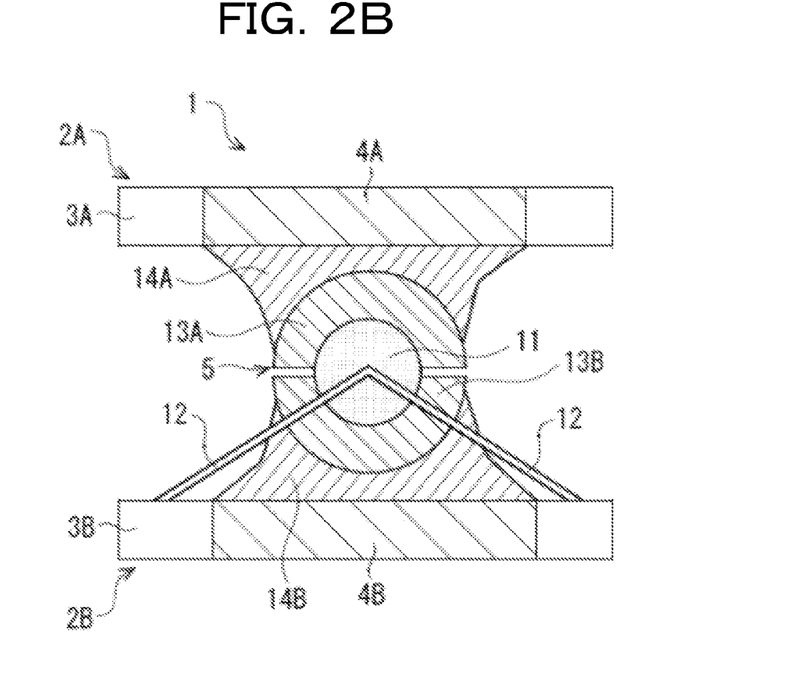
FIG. 2B is a cross-sectional view illustrating the exemplary switch.

Between the semiconductor chip 2A and the semiconductor chip 2B, a switch 5 is provided to control the electrical connection of the semiconductor chip 2A and the semiconductor chip 2B. FIGS. 2A and 2B are cross-sectional views illustrating an exemplary switch 5. The switch 5 illustrated in FIGS. 2A and 2B includes a core element 11 which expands and contracts depending on a temperature change, a heat generation unit 12 which heats the core element 11, and metal elements 13A and 13B which cover the core element 11. The metal element 13A is an example of a first metal element. The metal element 13B is an example of the second metal element.

The core element 11 has a spherical shape. The metal element 13A covers an upper half portion (a first portion) of the surface of the core element 11, and the metal element 13B covers a lower half portion (a second portion) of the surface of the core element 11. Thus, the metal elements 13A and 13B have hemispherical shapes with an internal space. The core element 11 and the metal elements 13A and 13B are adhered by an adhesive (not illustrated).

The heat generation unit 12 is a heating element such as a metal or carbon nanotube. A metal with high conductivity may be used as the heat generation unit 12. The heat generation unit 12 is connected to an electrode (not illustrated) of the semiconductor chip 2B through the inside of the core element 11. The heat generated by the heat generation unit 12 by causing electricity to flow through the heat generation unit 12 is transferred to the core element 11 which is in contact with the heat generation unit 12 so that the core element 11 is heated. FIGS. 2A and 2B illustrate an example in which the heat generation unit 12 is connected to the electrode (not illustrated) of the semiconductor chip 2B. Without being limited to this example, however, the heat generation unit 12 may be connected to an electrode (not illustrated) of the semiconductor chip 2A.

The core element 11 has an insulating nature. The core element 11 has either positive expansibility or negative expansibility. In a case where the core element 11 has the positive expansibility, when the core element 11 is heated so that the temperature of the core element 11 is raised, the core element 11 expands. After the core element 11 expands, when the heating of the core element 11 is stopped so that the temperature of the core element 11 drops, the core element 11 contracts. Meanwhile, in the case where the core element 11 has negative expansibility, when the core element 11 is heated so that the temperature of the core element 11 is raised, the core element 11 contracts. After the core element 11 contracts, when the heating of the core element 11 is stopped so that the temperature of the core element 11 drops, the core element 11 expands.

The metal elements 13A and 13B are made of, for example, copper (Cu), but may be made of other metal as well. The metal element 13A is connected to a through electrode 4A via a conductor 14A. The metal element 13B is connected to a through electrode 4B via a conductor 14B. The conductors 14A, 14B are made of, for example, a conductive adhesive or a solder.

The heat generation unit 12 passes through the inside of the metal element 13B. The surrounding of the heat generation unit 12 passing through the inside of the metal element 13B is covered by an insulator such as an epoxy resin, and as a result, the heat generation unit 12 and the metal element 13B are insulated.

In FIG. 2A, the metal element 13A and the metal element 13B are in contact with each other. When the metal element 13A and the metal element 13B are in contact with each other, the semiconductor chip 2A and the semiconductor chip 2B are electrically connected with each other through the metal elements 13A and 13B and the conductors 14A and 14B. Accordingly, a signal transmitted/received between the semiconductor chip 2A and the semiconductor chip 2B passes through the metal elements 13A and 13B and the conductors 14A and 14B. Since the core element 11 has an insulating nature, the signal transmitted/received between the semiconductor chip 2A and the semiconductor chip 2B does not pass through the core element 11.

In FIG. 2B, the metal element 13A and the metal element 13B become in non-contact with each other. When the metal element 13A and the metal element 13B become in non-contact with each other, the semiconductor chip 2A and the semiconductor chip 2B are electrically separated from each other.

For example, it is assumed that the state before the core element 11 expands is the state illustrated in FIG. 2A, and the state after the core element 11 expands is the state illustrated in FIG. 2B. In such a case, when the core element 11 expands, the metal element 13A and the metal element 13B become in non-contact with each other so that the semiconductor chip 2A and the semiconductor chip 2B are electrically separated from each other.

Descriptions will be made on the electrical connection and electrical separation of the semiconductor chip 2A and the semiconductor chip 2B in a case where the core element 11 has positive expansibility. In the state illustrated in FIG. 2A, when the heat generation unit 12 generates heat so that the core element 11 is heated, the temperature of the core element 11 is raised. In the case where the core element 11 has positive expansibility, the core element 11 expands. When the core element 11 expands, as illustrated in FIG. 2B, the metal element 13A is pushed upward and the metal element 13B is pushed downward. That is, when the core element 11 expands, as illustrated in FIG. 2B, the metal element 13A is moved in a direction away from the metal element 13B and the metal element 13B is moved in a direction away from the metal element 13A. As a result, the metal element 13A and the metal element 13B become in non-contact with each other so that the semiconductor chip 2A and the semiconductor chip 2B are electrically separated from each other.

In the state illustrated in FIG. 2B, when the heat generation of the heat generation unit 12 is stopped so that the heating of the core element 11 is stopped, the temperature of the core element 11 drops. In the case where the core element 11 has a positive expansibility, the core element 11 contracts. When the core element 11 contracts, as illustrated in FIG. 2A, the metal element 13A is pulled downward and the metal element 13B is pulled upward. That is, when the core element 11 returns to its original shape prior to the heating, as illustrated in FIG. 2A, the metal element 13A is moved in a direction approaching the metal element 13B, and the metal element 13B is moved in a direction approaching the metal element 13A. As a result, the metal element 13A and the metal element 13B come in contact with each other so that the semiconductor chip 2A and the semiconductor chip 2B are electrically connected with each other.

Next, descriptions will be made on the electrical connection and electrical separation of the semiconductor chip 2A and the semiconductor chip 2B in a case where the core element 11 has negative expansibility. In the state illustrated in FIG. 2B, when the heat generation unit 12 generates heat so that the core element 11 is heated, the temperature of the core element 11 is raised. In the case where the core element 11 has negative expansibility, the core element 11 contracts. When the core element 11 contracts, as illustrated in FIG. 2A, the metal element 13A is pulled downward and the metal element 13B is pulled upward. That is, when the core element 11 contracts, as illustrated in FIG. 2A, the metal element 13A is moved in the direction approaching the metal element 13B, and the metal element 13B is moved in the direction approaching the metal element 13A. As a result, the metal element 13A and the metal element 13B come in contact with each other so that the semiconductor chip 2A and the semiconductor chip 2B are electrically connected with each other.

In the state illustrated in FIG. 2A, when the heat generation of the heat generation unit 12 is stopped so that the heating of the core element 11 is stopped, the temperature of the core element 11 drops. In the case where the core element 11 has negative expansibility, the core element 11 expands. When the core element 11 expands, as illustrated in FIG. 2B, the metal element 13A is pushed upward and the metal element 13B is pushed downward. That is, when the core element 11 returns to its original shape prior to the heating, as illustrated in FIG. 2B, the metal element 13A is moved in the direction away from the metal element 13B and the metal element 13B is moved in the direction away from the metal element 13A. As a result, the metal element 13A and the metal element 13B become in non-contact with each other so that the semiconductor chip 2A and the semiconductor chip 2B are electrically separated from each other.

In the case where the core element 11 has positive expansibility, when the temperature of the core element 11 is raised as the heat generation unit 12 generates heat, the core element 11 expands so that the metal element 13A and the metal element 13B become in non-contact with each other. In addition, in the case where the core element 11 has negative expansibility, when the temperature of the core element 11 drops as the heat generation unit 12 stops heat generation, the core element 11 expands so that the metal element 13A and the metal element 13B become in non-contact with each other. As described above, since the temperature of the core element 11 is changed as the heat generation unit 12 generates heat and stops heat generation, the core element 11 expands so that the metal element 13A and the metal element 13B become in non-contact with each other.

In the case where the core element 11 has positive expansibility, when the temperature of the core element 11 drops as the heat generation unit 12 stops heat generation, the core element 11 contracts so that the metal element 13A and the metal element 13B come in contact with each other. In addition, in the case where the core element 11 has negative expansibility, when the temperature of the core element 11 is raised as the heat generation unit 12 generates heat, the core element 11 contracts so that the metal element 13A and the metal element 13B come in contact with each other. As described above, since the temperature of the core element 11 is changed as the heat generation unit 12 generates heat and stops heat generation, the core element 11 contracts so that the metal element 13A and the metal element 13B come in contact with each other.

When the metal element 13A and the metal element 13B come in contact with each other, the semiconductor chip 2A and the semiconductor chip 2B are electrically connected with each other. When the metal element 13A and the metal element 13B become in non-contact with each other, the semiconductor chip 2A and the semiconductor chip 2B are electrically separated from each other. Based on the heat generation and stopping of the heat generation of the heat generation unit 12, the electrical connection and separation between the semiconductor chip 2A and the semiconductor chip 2B which are laminated one on another may be selectively performed.

By using residual stress at the time of molding, for example, PTFE (polytetrafluoro ethylene), PFA (tetrafluoroethylene-perfluoroalkylvinylether copolymer), or a silicon resin, the core element 11 may be made not to return to its original shape even if the temperature of the core element 11 drops after the temperature of the core element 11 is raised so that the core element 11 expands. The core element 11 is molded by compressing, for example, PTFE, PFA, or a silicon resin while applying heat to the PTFE, the PFA, or the silicon resin. With this molding, the core element 11 may be made not to return to its original shape once it expands. Accordingly, even if the temperature of the core element 11 drops after the core element 11 expands so that the semiconductor chip 2A and the semiconductor chip 2B are electrically separated from each other, the core element 11 may maintain the electrically separated state of the semiconductor chip 2A and the semiconductor chip 2B without returning to its original shape.

By using a shape memory effect of, for example, PTFE, PFA, or a silicon resin, the core element 11 may be made not to return to its original shape even if the temperature of the core element 11 drops after the temperature of the core element 11 is raised so that the core element 11 contracts. The core element 11 is molded by drawing, for example, PTFE, PFA, or a silicon resin while applying heat to the PTFE, the PFA, or the silicon resin. With this molding, the core element 11 may be made not to return to its original shape once it contracts. Accordingly, even if the temperature of the core element 11 drops after the core element 11 contracts so that the semiconductor chip 2A and the semiconductor chip 2B are electrically connected with each other, the core element 11 may maintain the electrically connected state of the semiconductor chip 2A and the semiconductor chip 2B without returning to its original shape.

Since the metal element 13A and the metal element 13B come in contact with each other or become in non-contact with each other depending on the expansion or contraction of the core element 11, a member with a large thermal expansion coefficient may be used as the core element 11. In addition, the core element 11 may have heat resistance that enables the core element 11 to be mounted through a reflow process.

The core element 11 having positive expansibility is made of, for example, PTFE, PFA, or a silicon resin. The thermal expansion coefficient of PTFE is about $10 \times 10^{-5}/°$ C., and the heat resistant temperature of PTFE is about 260° C. The thermal expansion coefficient of PFA is about $12 \times 10^{-5}/°$ C., and the heat resistant temperature of PFA is about 260° C. The thermal expansion coefficient of the silicon resin is about $25 \times 10^{-5}/°$ C., and the heat resistant temperature of the silicon resin is about 220° C.

The core element 11 having negative expansibility is made of, for example, manganese nitride ($Mn_3XN$) or zirconium tungstate ($ZrW_2O_8$). The thermal expansion coefficient of the manganese nitride is about $-1.6 \times 10^{-5}/°$ C., and the heat resistant temperature of the manganese nitride is about 800° C. The thermal expansion coefficient of the zirconium tungstate is about $-0.9 \times 10^{-5}/°$ C., and the heat resistant temperature of the zirconium tungstate is about 1000° C.

Figure 3:
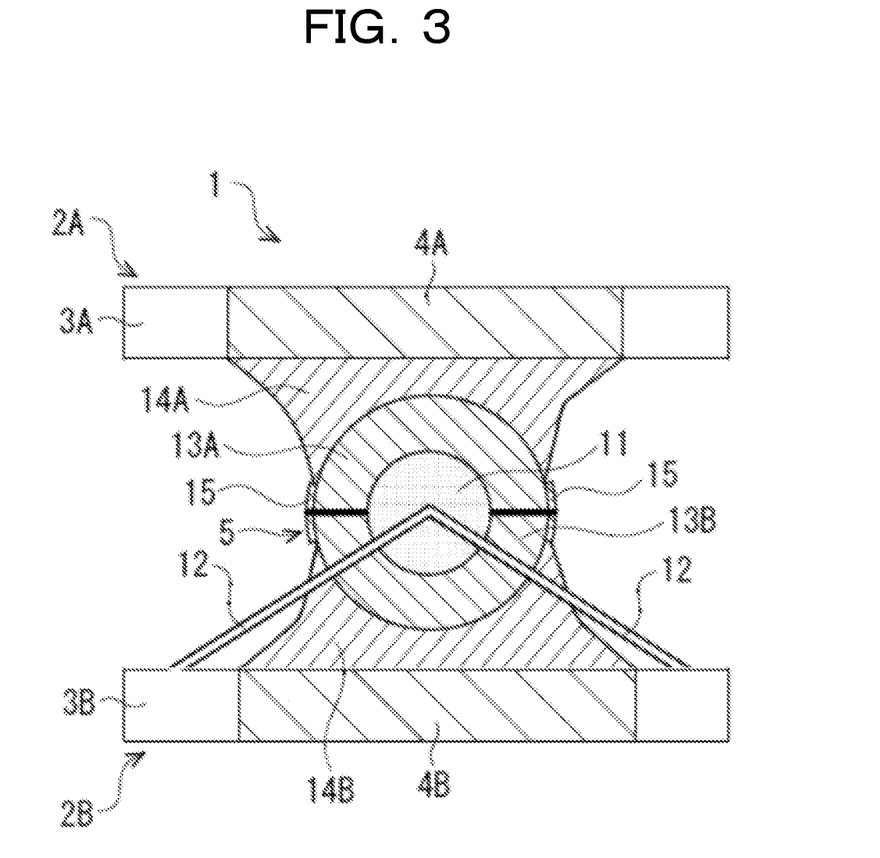
FIG. 3 is a cross-sectional view illustrating another exemplary switch.

When the conductors 14A and 14B are made of a solder, as illustrated in FIG. 3, a restraint portion 15 may be formed on the metal elements 13A and 13B. FIG. 3 is a cross-sectional view illustrating an example of the switch 5. For example, the restraint portion 15 may be formed around a contact portion of the metal element 13A and the metal element 13B. The restraint portion 15 suppresses the rise of the solder during the reflow process when forming the conductors 14A and 14B, and suppresses the conductor 14A and the conductor 14B from being contacted with each other. In addition, an elastic solder may be used as the conductors 14A and 14B. When the elastic solder is used as the conductors 14A and 14B, the movement of the metal elements 13A and 13B may be facilitated when the core element 11 expands and contracts. A solder containing copper such as Sn—Ag—Cu has an elastic nature as compared to a solder that does not contain copper.

Figure 4A:
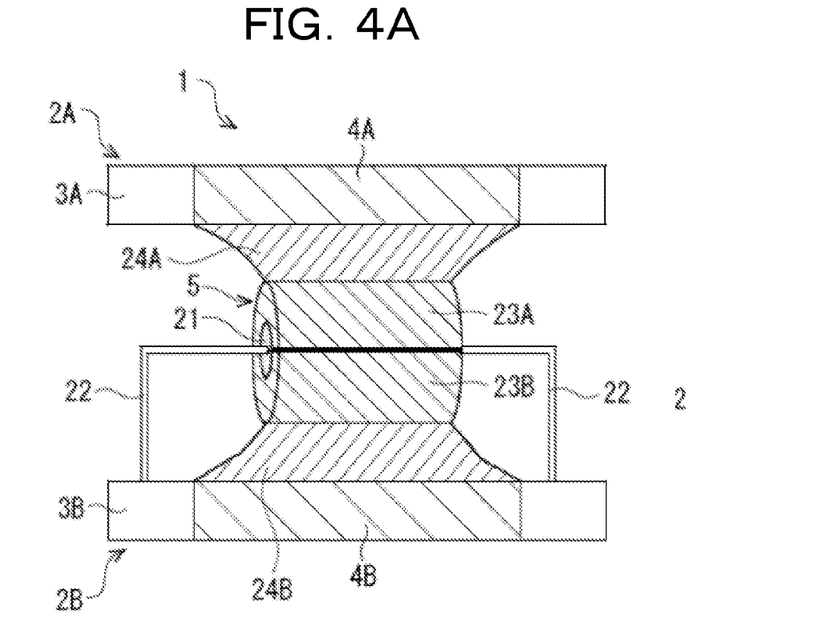
FIG. 4A is a cross-sectional view illustrating still another exemplary switch.
Figure 4B:
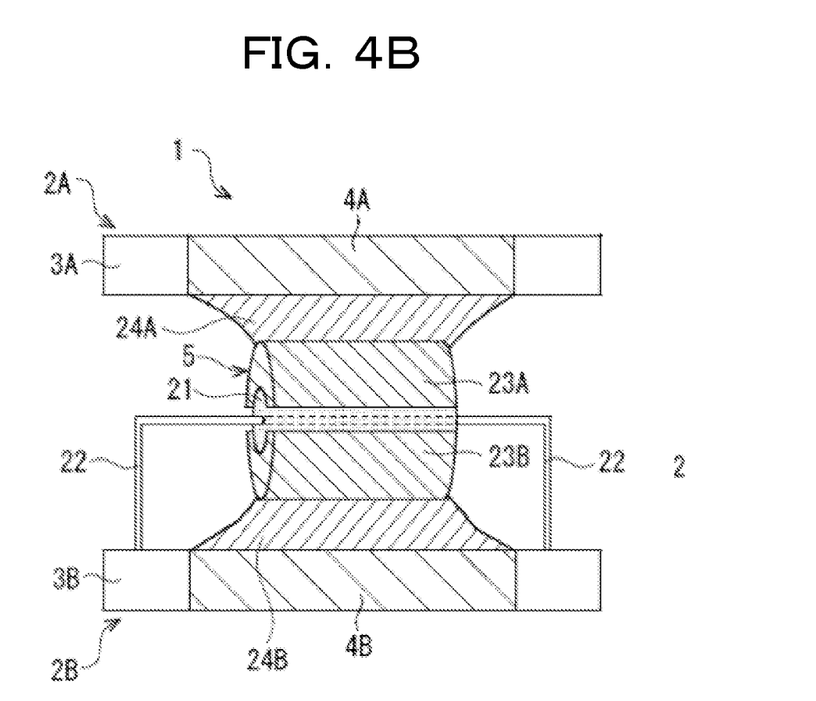
FIG. 4B is a cross-sectional view illustrating the still another exemplary switch.

FIGS. 4A and 4B are cross-sectional view of an example of the switch 5. The switch 5 illustrated in FIGS. 4A and 4B includes a core element 21 which expands and contracts by a temperature change, a heat generation unit 22 which heats the core element 21, and metal element 23A and 23B which cover the core element 21. The metal element 23A is an example of the first metal element. The metal element 23B is an example of the second metal element.

The core element 21 has a cylindrical shape. The metal element 23A covers an upper half portion (first portion) of the surface of the core element 21, and the metal element 23B covers a lower half portion (second portion) of the surface of the core element 21. Thus, the metal elements 23A and 23B has a semi-cylindrical shape with an internal space. The core element 21 and the metal elements 23A and 23B are adhered to each other by an adhesive (not illustrated).

The heat generation unit 22 is a heating element made of, for example, a metal or carbon nanotube. A metal with high thermal conductivity may be used as the heat generation unit 22. The heat generation unit 22 is connected to an electrode (not illustrated) of the semiconductor chip 2B from an exposed portion through the inside of the core element 21. The heat generated by the heat generation unit 22 by causing electricity to flow through the heat generation unit 22 is transferred to the core element 21 which is in contact with the heat generation unit 22 so that the core element 21 is heated. FIGS. 4A and 4B illustrate an example in which the heat generation unit 22 is connected to the electrode (not illustrated) of the semiconductor chip 2B. Without being limited to this example, however, the heat generation unit 22 may be connected to an electrode (not illustrated) of the semiconductor chip 2A.

The core element 21 has an insulating nature. The core element 21 has either positive expansibility or negative expansibility. In a case where the core element 21 has positive expansibility, the core element 21 expands when the core element 21 is heated so that the temperature of the core element 21 is raised. After the core element 21 expands, when the heating of the core element 21 is stopped so that the temperature of the core element 21 drops, the core element 21 contracts. Meanwhile, in a case where the core element 21 has negative expansibility, the core element 21 contracts when the core element 21 is heated so that the temperature of the core element 21 is raised. After the core element 21 contracts, when the heating of the core element 21 is stopped so that the temperature of the core element 21 drops, the core element 21 expands.

The metal elements 23A and 23B may be made of, for example, copper (Cu), but may be made of other metal. The metal element 23A is connected to a through electrode 4A through a conductor 24A. The metal element 23B is connected to a through electrode 4B through a conductor 24B. The conductors 24A and 24B are made of, for example, a conductive adhesive or a solder.

As illustrated in FIGS. 4A and 4B, since the heat generation unit 22 is in contact with the exposed portion of the core element 21, the heat generation unit 22 is not in contact with the metal elements 23A and 23B. Accordingly, the heat generation unit 22 and the metal elements 23A and 23B are insulated.

In FIG. 4A, the metal element 23A and the metal element 23B are in contact with each other. In the case where the metal element 23A and the metal element 23B are in contact with each other, the semiconductor chip 2A and the semiconductor chip 2B are electrically connected with each other through the metal elements 23A and 23B and the conductors 24A and 24B. Accordingly, a signal transmitted/received between the semiconductor chip 2A and the semiconductor chip 2B passes through the metal elements 23A and 23B and the conductors 24A and 24B. Since the core element 21 has an insulating nature, the signal transmitted/received between the semiconductor chip 2A and the semiconductor chip 2B does not pass through the core element 21.

In FIG. 4B, the metal element 23A and the metal element 23B become in non-contact with each other. When the metal element 23A and the metal element 23B become in non-contact with each other, the semiconductor chip 2A and the semiconductor chip 2B are electrically separated from each other.

For example, the state of the core element 21 prior to expansion is the state illustrated in FIG. 4, and the state of the core element 21 after expansion is the state illustrated in FIG. 4B. In this case, when the core element 21 expands, the metal element 23A and the metal element 23B become in non-contact with each other so that the semiconductor chip 2A and the semiconductor chip 2B are electrically separated from each other.

Descriptions will be made on the electrical connection and electrical separation of the semiconductor chip 2A and the semiconductor chip 2B in a case where the core element 21 has positive expansibility. In the state illustrated in FIG. 4A, when the heat generation unit 22 generates heat so that the core element 21 is heated, the temperature of the core element 21 is raised. In the case where the core element 21 has positive expansibility, the core element 21 expands. When the core element 21 expands, as illustrated in FIG. 4B, the metal element 23A is pushed upward and the metal element 23B is pushed downward. That is, when the core element 21 expands, as illustrated in FIG. 4B, the metal element 23A is moved in a direction away from the metal element 23B and the metal element 23B is moved in a direction away from the metal element 23A. As a result, the metal element 23A and the metal element 23B become in non-contact with each other so that the semiconductor chip 2A and the semiconductor chip 2B are electrically separated from each other.

In the state illustrated in FIG. 4B, when the heat generation of the heat generation unit 22 is stopped so that the heating of the core element 21 is stopped, the temperature of the core element 21 drops. In the case where the core element 21 has positive expansibility, the core element 21 contracts. When the core element 21 contracts, as illustrated in FIG. 4A, the metal element 23A is pulled downward and the metal element 23B is pulled upward. That is, when the core element 21 returns to its original shape prior to the heating, as illustrated in FIG. 4A, the metal element 23A is moved in a direction approaching the metal element 23B and the metal element 23B is moved in a direction approaching the metal element 13A. As a result, the metal element 23A and the metal element 23B come in contact with each other so that the semiconductor chip 2A and the semiconductor chip 2B are electrically connected with each other.

Next, descriptions will be made on the electrical connection and electrical separation of the semiconductor chip 2A and the semiconductor chip 2B in a case where the core element 21 has negative expansibility. In the state illustrated in FIG. 4B, when the heat generation unit 22 generates heat so that the core element 21 is heated, the temperature of the core element 21 is raised. In the case where the core element 21 has negative expansibility, the core element 21 contracts. When the core element 21 contracts, as illustrated in FIG. 4A, the metal element 23A is pulled downward and the metal element 23B is pulled upward. That is, when the core element 21 contracts, as illustrated in FIG. 4A, the metal element 23A is moved in the direction approaching the metal element 23B and the metal element 23B is moved in the direction approaching the metal element 23A. As a result, the metal element 23A and the metal element 23B come in contact with each other so that the semiconductor chip 2A and the semiconductor chip 2B are electrically connected with each other.

In the state illustrated in FIG. 4A, when the heat generation of the heat generation unit 22 is stopped so that the heating of the core element 21 is stopped, the temperature of the core element 21 drops. In the case where the core element 21 has negative expansibility, the core element 21 expands. When the core element 21 expands, as illustrated in FIG. 4B, the metal element 23A is pushed upward and the metal element 23B is pushed downward. That is, when the core element 21 returns to its original shape prior to the heating, as illustrated in FIG. 4B, the metal element 23A is moved in the direction away from the metal element 23B and the metal element 23B is moved in the direction away from the metal element 23A. As a result, the metal element 23A and the metal element 23B become in non-contact with each other so that the semiconductor chip 2A and the semiconductor chip 2B are electrically separated from each other.

In the case where the core element 21 has positive expansibility, when the temperature of the core element 21 is raised as the heat generation unit 22 generates heat, the core element 21 expands so that the metal element 23A and the metal element 13B become in non-contact with each other. In addition, in the case where the core element 21 has negative expansibility, when the temperature of the core element 21 drops as the heat generation unit 22 stops heat generation, the core element 21 expands so that the metal element 23A and the metal element 23B become in non-contact with each other. As described above, since the temperature of the core element 21 is changed as the heat generation unit 22 generates heat and stops heat generation, the core element 21 expands so that the metal element 23A and the metal element 23B become in non-contact with each other.

In the case where the core element 21 has positive expansibility, when the temperature of the core element 21 drops as the heat generation unit 22 stops heat generation, the core element 21 contracts so that the metal element 23A and the metal element 23B come in contact with each other. In addition, in the case where the core element 21 has negative expansibility, when the temperature of the core element 21 is raised as the heat generation unit 22 generates heat, the core element 21 contracts so that the metal element 23A and the metal element 23B comes in contact with each other. As described, since the temperature of the core element 21 is changed as the heat generation unit 22 generates heat and stops heat generation, the core element 21 contracts so that the metal element 23A and the metal element 23B come in contact with each other.

When the metal element 23A and the metal element 23B come in contact with each other, the semiconductor chip 2A and the semiconductor chip 2B are electrically connected with each other. When the metal element 23A and the metal element 23B become in non-contact with each other, the semiconductor chip 2A and the semiconductor chip 2B are electrically separated from each other. Based on the heat generation and stopping of the heat generation of the heat generation unit 22, the electrical connection and separation between the semiconductor chip 2A and the semiconductor chip 2B which are laminated one on another may be selectively performed.

By using the residual stress at the time of molding, for example, PTFE, PFA, or a silicon resin, the core element 21 may be made not to return to its original shape even if the temperature of the core element 21 drops after the temperature of the core element 21 is raised so that the core element 21 expands. The core element 21 is molded by compressing, for example, PTFE, PFA, or a silicon resin while applying heat to the PTFE, the PFA, or the silicon resin. With the molding, the core element 21 may be made not to return to its original shape once it expands. Accordingly, even if the temperature of the core element 21 drops after the core element 21 expands so that the semiconductor chip 2A and the semi-conductor chip 2B are electrically separated from each other, the core element 21 may maintain the electrically separated state of the semiconductor chip 2A and the semiconductor chip 2B without returning to its original shape.

By using the shape memory effect of, for example, PTFE, PFA, or a silicon resin, the core element 21 may be made not to return to its original shape even if the temperature of the core element 21 drops after the temperature of the core element 21 is raised so that the core element 21 contracts. The core element 21 is molded by drawing, for example, PTFE, PFA, or a silicon resin while applying heat to the PTFE, the PFA, or the silicon resin. With this molding, the core element 21 may be made not to return to its original shape once it contracts. Accordingly, even if the temperature of the core element 21 drops after the core element 21 contracts so that the semiconductor chip 2A and the semiconductor chip 2B are electrically connected with each other, the core element 21 may maintain the electrically connected state of the semiconductor chip 2A and the semiconductor chip 2B without returning to its original shape.

Since the metal element 13A and the metal element 13B come in contact with each other or become in non-contact with each other depending on the expansion or contraction of the core element 11, a member with a large thermal expansion coefficient may be used as the core element 11. In addition, the core element 11 may have heat resistance that enables the core element 11 to be mounted through a reflow process. Descriptions on the core element 21 with negative expansibility will be omitted since it is the same as the core element 11 with negative expansibility.

When the conductors 24A and 24B are made of a solder, a restraint portion 15 (see, e.g., FIG. 3) may be formed on the metal elements 23A and 23B. For example, the restraint portion 15 may be formed around a contact portion of the metal element 23A and the metal element 23B. The restraint portion 15 suppresses the rise of the solder during the reflow process when forming the conductors 24A and 24B, and suppresses the conductor 24A and the conductor 24B from being contacted with each other. In addition, an elastic solder may be used as the conductors 24A and 24B. When the elastic solder is used as the conductors 24A and 24B, the movement of the metal element 23A and 23B may be facilitated when the core element 21 expands and contracts. A solder containing copper such as Sn—Ag—Cu has an elastic nature as compared to a solder that does not contain copper.

Figure 5:
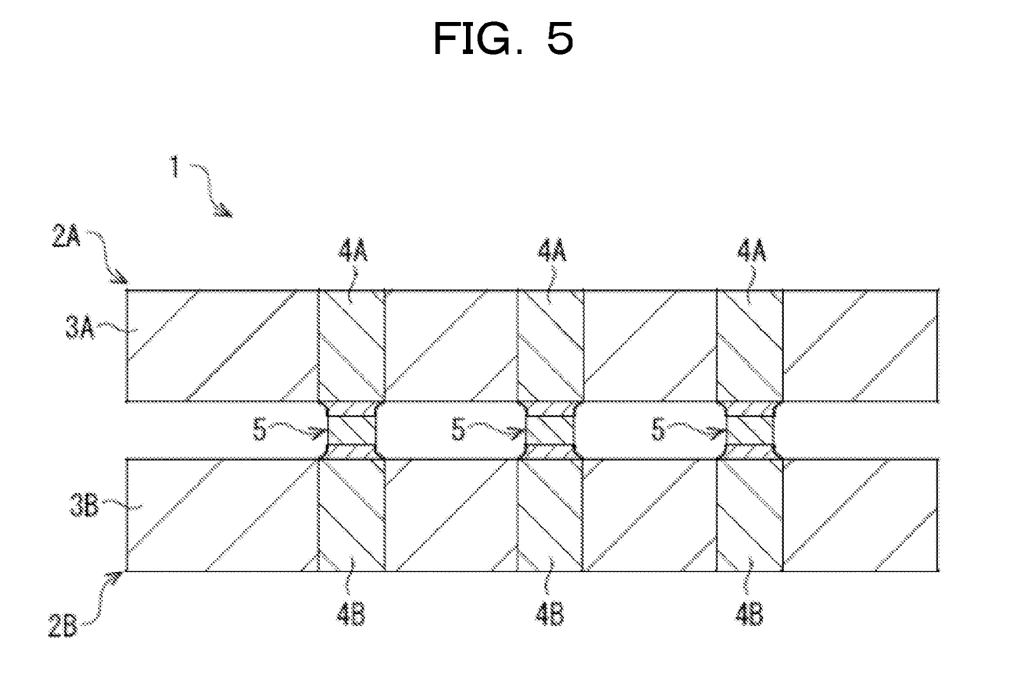
FIG. 5 is a view illustrating a configuration of another semiconductor device.

An impedance may be adjusted between the semiconductor chip 2A and the semiconductor chip 2B using a plurality of switches 5. FIG. 5 is a view illustrating a configuration of a semiconductor device 1 in a case where a plurality of switches 5 is provided between the semiconductor chip 2A and the semiconductor chip 2B. The semiconductor device 1 includes a plurality of laminated semiconductor chips 2. Although FIG. 5 illustrates two layers of semiconductor chips 2A and 2B, the number of laminated semiconductor chips 2 is not limited to the example illustrated in FIG. 5. The semiconductor chip 2A includes a semiconductor substrate 3A and a plurality of through electrodes 4A provided in the semiconductor substrate 3A. The semiconductor chip 2B includes a semiconductor substrate 3B and a plurality of through electrodes 4B provided in the semiconductor substrate 3B.

Figure 6:
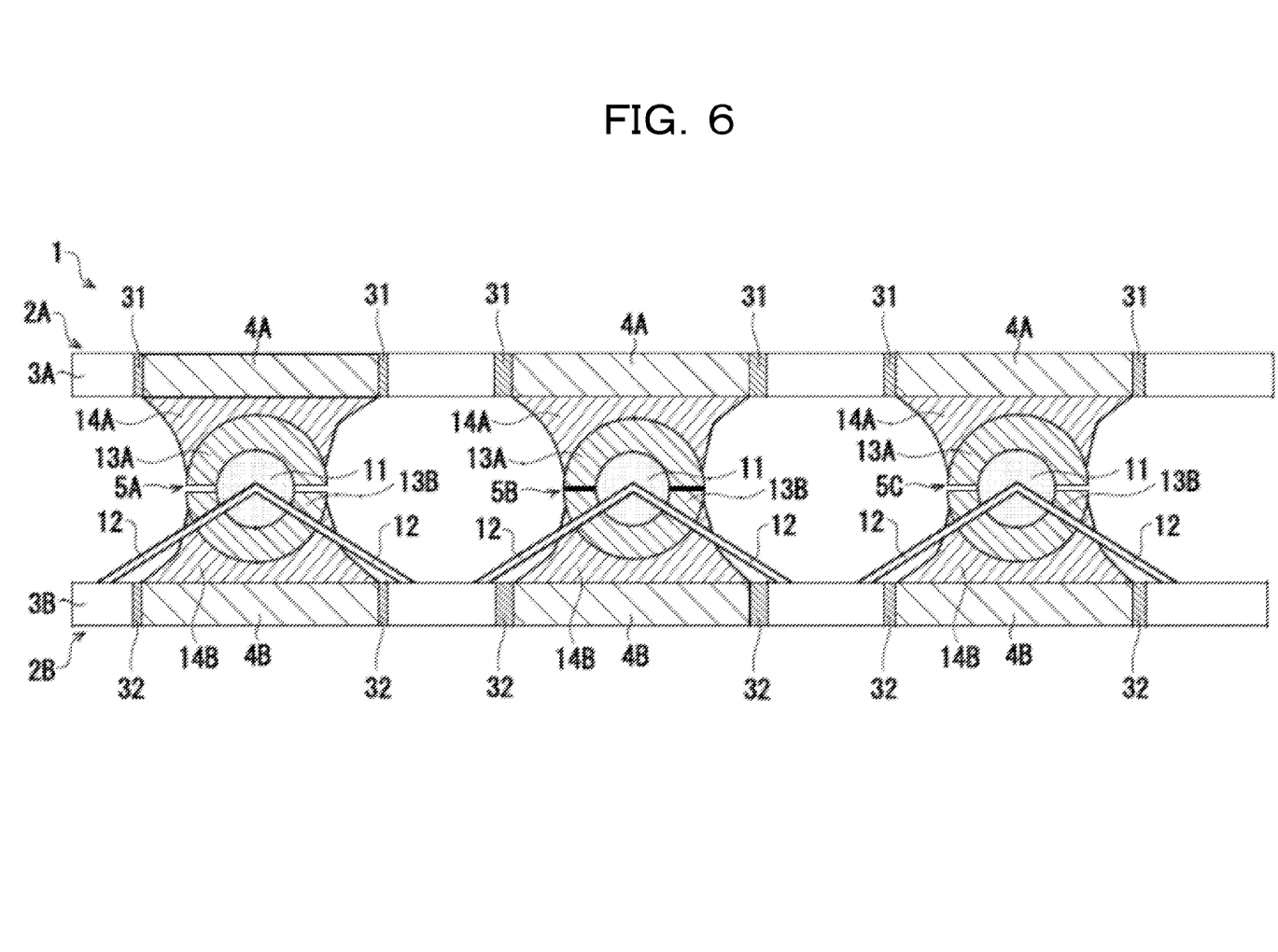
FIG. 6 is a cross-sectional view illustrating a plurality of exemplary switches.

The plurality of switches 5 is provided between the semiconductor chip 2A and the semiconductor chip 2B in order to control the electrical connection between the semiconductor chip 2A and the semiconductor chip 2B. FIG. 6 is a cross-sectional view illustrating the plurality of switches 5. FIG. 6 illustrates switches 5A to 5C, in which each of the switches 5A to 5C includes a core element 11, a heat generation unit 12, and metal elements 13A and 13B. Without being limited to the example illustrated in FIG. 6, the switches 5A to 5C may include a core element 21, a heat generation unit 22, and metal elements 23A and 23B as well.

On a side surface of each of the through electrodes 4A, an oxide film 31 is formed. The film thicknesses of the oxide films 31 formed on the side surfaces of respective through electrodes 4A are different from each other. On a side surface of each of the through electrodes 4B, an oxide film 32 is formed. The film thicknesses of the oxide films 32 formed on the side surfaces of respective through electrodes 4B are different from each other. When the film thicknesses of the oxide films 31 formed on the side surfaces of the through electrodes 4A and the film thicknesses of the oxide films 32 formed on the through electrodes 4B are thin, an impedance of a signal transmitted/received between the semiconductor chip 2A and the semiconductor chip 2B through the switches 5 becomes small. When the film thicknesses of the oxide films 31 formed on the side surfaces of the through electrodes 4A and the film thicknesses of the oxide films 32 formed on the through electrodes 4B are thick, an impedance of a signal transmitted/received between the semiconductor chip 2A and the semiconductor chip 2B through the switches 5 becomes large.

In the example illustrated in FIG. 6, the film thickness of the oxide film 31 formed on the side surface of the through electrode 4A connected to the switch 5A is thinner than the film thickness of the oxide film 31 formed on the side surface of the through electrode 4A connected to the switch 5B. In the example illustrated in FIG. 6, the film thickness of the oxide film 32 formed on the side surface of the through electrode 4A connected to the switch 5A is thinner than the film thickness of the oxide film 32 formed on the side surface of the through electrode 4A connected to the switch 5B. Accordingly, an impedance of a signal transmitted/received between the semiconductor chip 2A and the semiconductor chip 2B through the switch 5A is smaller than an impedance of a signal transmitted/received between the semiconductor chip 2A and the semiconductor chip 2B through the switch 5B.

In the example illustrated in FIG. 6, the film thickness of the oxide film 31 formed on the side surface of the through electrode 4A connected to the switch 5A is thinner than the film thickness of the oxide film 31 formed on the side surface of the through electrode 4A connected to the switch 5C. In the example illustrated in FIG. 6, the film thickness of the oxide film 32 formed on the side surface of the through electrode 4A connected to the switch 5A is thinner than the film thickness of the oxide film 32 formed on the side surface of the through electrode 4A connected to the switch 5C. Accordingly, an impedance of a signal transmitted/received between the semiconductor chip 2A and the semiconductor chip 2B through the switch 5A is smaller than an impedance of a signal transmitted/received between the semiconductor chip 2A and the semiconductor chip 2B through the switch 5C.

In the example illustrated in FIG. 6, the film thickness of the oxide film 31 formed on the side surface of the through electrode 4A connected to the switch 5B is thicker than the film thickness of the oxide film 31 formed on the side surface of the through electrode 4A connected to the switch 5C. In the example illustrated in FIG. 6, the thickness of the oxide film 32 formed on the side surface of the through electrode 4A connected to the switch 5B is thicker than the oxide film 32 formed on the side surface of the through electrode 4A connected to the switch 5C. Accordingly, an impedance of a signal transmitted/received between the semiconductor chip 2A and the semiconductor chip 2B through the switch 5A is smaller than an impedance of a signal transmitted/received between the semiconductor chip 2A and the semiconductor chip 2B through the switch 5C.

When a signal is transmitted/received between the semiconductor chip 2A and the semiconductor chip 2B through the switch 5B, as illustrated in FIG. 6, the metal element 13A and the metal element 13B which are provided in the switch 5B are caused to be in contact with each other, and the metal elements 13A and the metal elements 13B which are provided in the switches 5A and 5C are caused to be in non-contact with each other. When a signal is transmitted/received between the semiconductor chip 2A and the semiconductor chip 2B through the switch 5A, the metal element 13A and the metal element 13B which are provided in the switch 5A are caused to be in contact with each other, and the metal elements 13A and the metal elements 13B which are provided in the switches 5B and 5C are caused to be in non-contact with each other. When a signal is transmitted between the semiconductor chip 2A and the semiconductor chip 2B through the switch 5C, the metal element 13A and the metal element 13B which are provided in the switch 5C are caused to be in contact with each other, and the metal elements 13A and the metal elements 13B which are provided in the switches 5A and 5B are caused to be in non-contact with each other.

The semiconductor chip 2A and the semiconductor chip 2B are electrically connected with each other through any one of the plurality of switches 5 (the switches 5A to 5C in FIG. 6) so that a signal is transmitted/received between the semiconductor chip 2A and the semiconductor chip 2B. That is, any one of the plurality of switches 5 (the switches 5A to 5C in FIG. 6) is selected, and a signal is transmitted/received between the semiconductor chip 2A and the semiconductor chip 2B through the selected switch 5 (the switch 5B in FIG. 6). By selecting any one of the plurality of switches 5, the impedance of the signal transmitted/received between the semiconductor chip 2A and the semiconductor chip 2B may be adjusted according to the transmission speed of the signal transmitted/received between the semiconductor chip 2A and the semiconductor chip 2B.

Descriptions will be made on the manufacturing and mounting of a switch 5. Hereinafter, descriptions will be made on the manufacturing and mounting of the switch 5 including the core element 11, the heat generation unit 12, and the metal elements 13A and 13B. The manufacturing and mounting of the switch 5 including the core element 11, the heat generation unit 12, and the metal elements 13A and 13B may well be applied to the manufacturing and mounting of the switch 5 including the core element 21, the heat generation unit 22, and the metal elements 23A and 23B.

Figure 7:
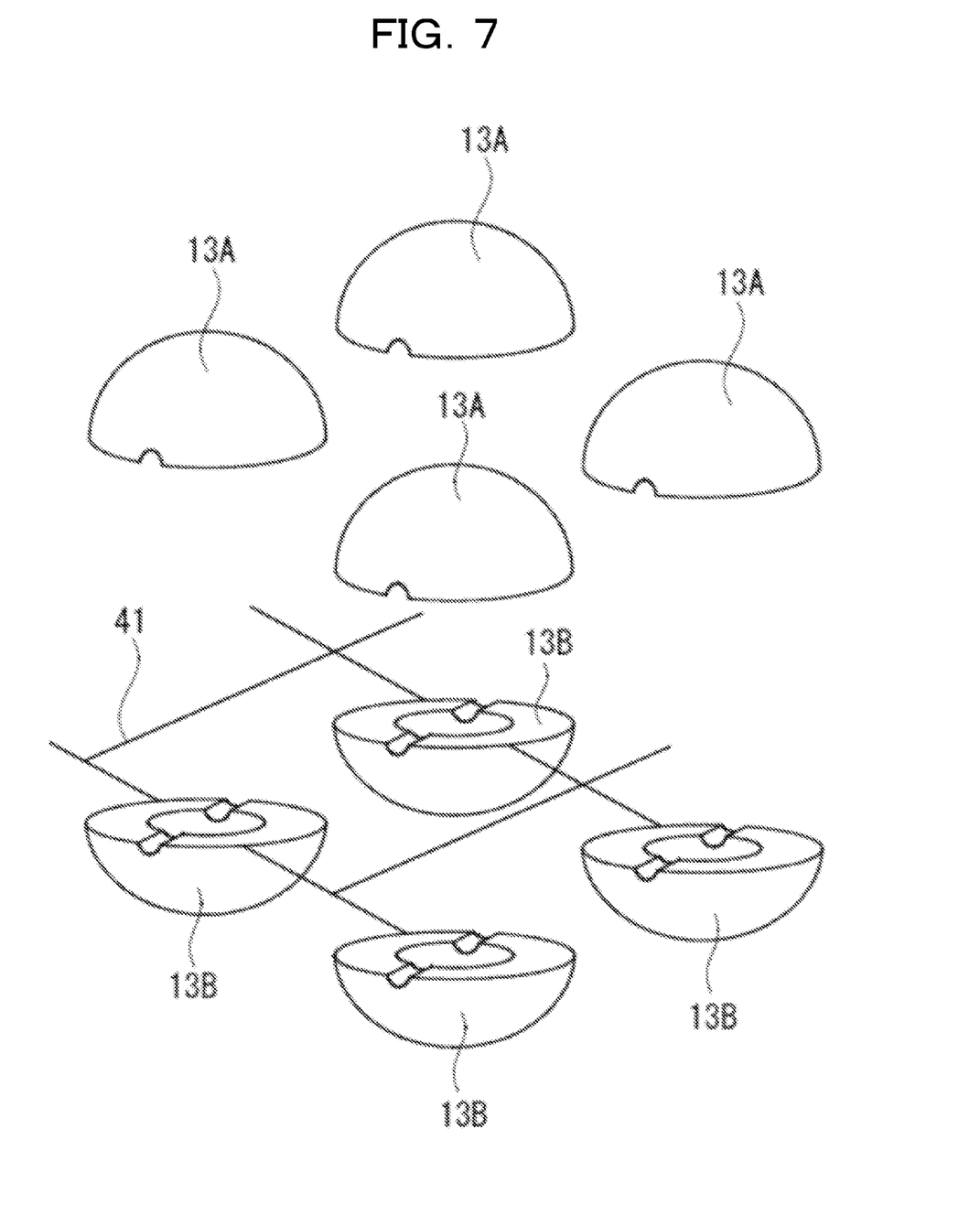
FIG. 7 is a perspective view illustrating metal elements.

First, metal elements 13A and 13B that cover a core element 11 are formed using a mold. FIG. 7 is a perspective view illustrating the metal elements 13A and 13B formed using a mold. In order to facilitate manufacturability (positioning) when mounting the switch 5 between the through electrode 4A of the semiconductor chip 2A and the through electrode 4B of the semiconductor chip 2B, a plurality of metal elements 13B may be connected by an insulative wire 41.

Figure 8:
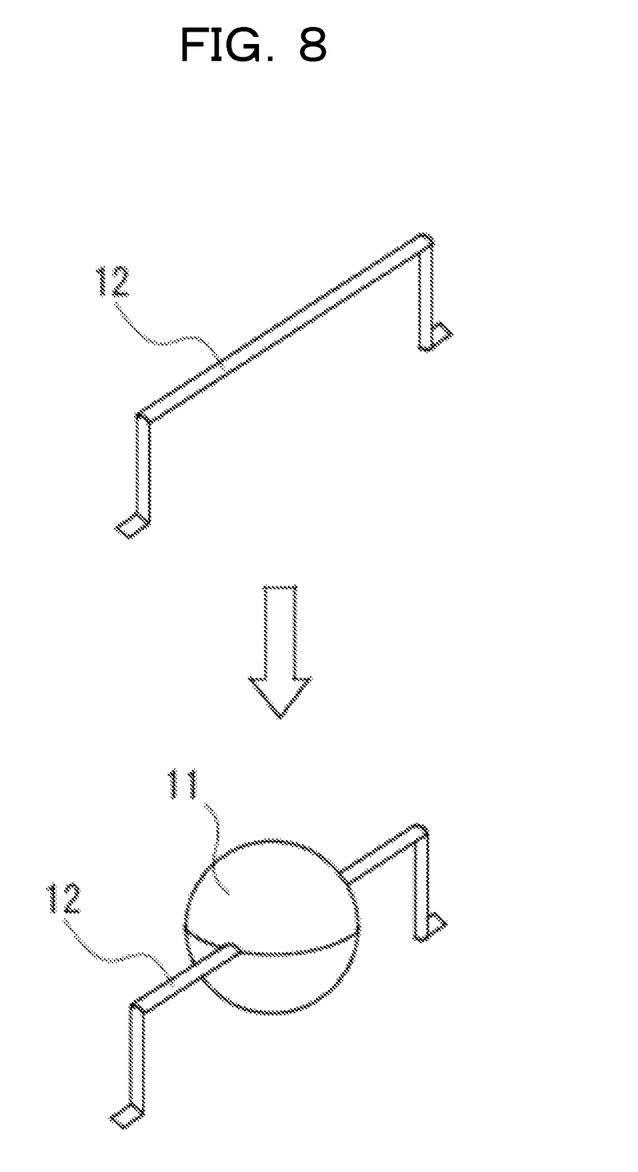
FIG. 8 is a perspective view illustrating a core element and a heat generation unit.

Subsequently, as illustrated in FIG. 8, a heat generation unit 12 passing through the inside of a core element 11 is formed, and a spherical core element 11 is formed using a mold. FIG. 8 is a perspective view illustrating a core element 11 and a heat generation unit 12. For example, when the core element 11 is made of a resin, the core element 11 is formed by introducing the resin into the mold and solidifying the resin. In this case, the heat generation unit 12 is positioned in relation to the core element 11 such that the heat generation unit 12 passes through the core element 11.

Figure 9:
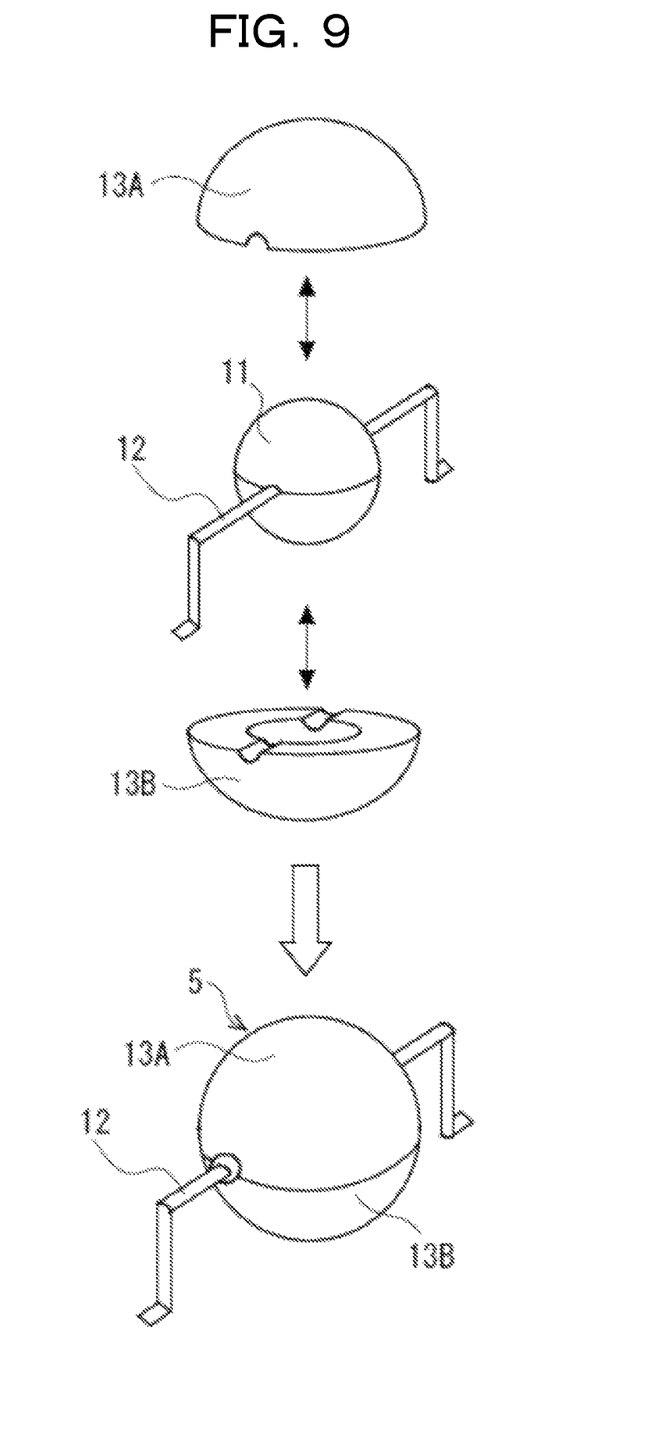
FIG. 9 is a perspective view illustrating a switch, a core element, a heat generation unit, and metal elements.

Next, as illustrated in FIG. 9, the core element 11 and the metal elements 13A and 13B are adhered to each other. FIG. 9 is a perspective view illustrating a switch 5, a core element 11, a heat generation unit 12, and metal elements 13A and 13B. An adhesive is coated on the upper half portion of the surface of the core element 11 to adhere the core element 11 and the metal element 13A. The adhesive may be coated on a portion of the upper half portion of the surface of the core element 11 to adhere the core element 11 and the metal element 13A. The adhesive is coated on a lower half portion of the surface of the core element 11 to adhere the core element 11 and the metal element 13B. The adhesive may be coated on a portion of the lower half portion of the surface of the core element 11 to adhere the core element 11 and the metal element 13B.

Figure 10:
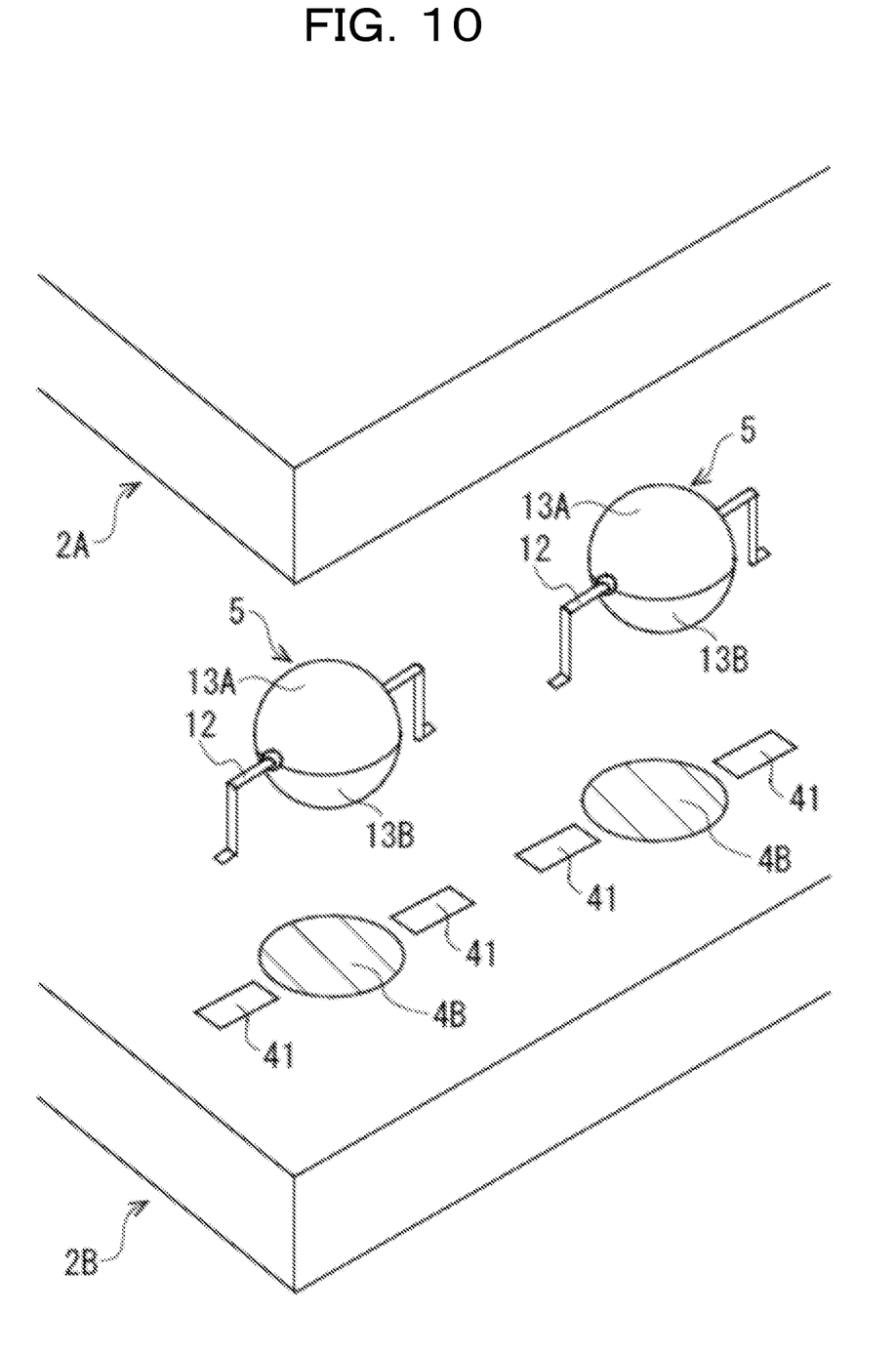
FIG. 10 is a view illustrating an example in which switches are disposed between semiconductor chips.

Subsequently, a solder is coated on the through electrode 4A of the semiconductor chip 2A, the through electrode 4B of the semiconductor chip 2A, and the electrode 41, and then, as illustrated in FIG. 10, the switches 5 are disposed between the semiconductor chip 2A and the semiconductor chip 2B. FIG. 10 illustrates an example in which the switches 5 are disposed between the semiconductor chip 2A and the semiconductor chip 2B. Subsequently, the switches 5 are mounted on the semiconductor chips 2A and 2B through a reflow process.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
    a first semiconductor chip including a first electrode;
    a second semiconductor chip including a second electrode; and
    a switch including a core element configured to contract and expand by a temperature change, a heat generation unit configured to heat the core element, a first metal element configured to cover the core element and connected to the first electrode, and a second metal element configured to cover the core element and connected to the second electrode,
    wherein, when the core element contracts, the first metal element and the second metal element come in contact with each other so that the first semiconductor chip and the second semiconductor chip are electrically connected with each other, and
    when the core element expands, the first metal element and the second metal element become in non-contact with each other so that the first semiconductor chip and the second semiconductor chip are electrically separated from each other.

2. The semiconductor device according to claim 1, wherein the first semiconductor chip includes a plurality of first electrodes, and a plurality of first oxide films formed on side surfaces of the plurality of first electrodes, respectively,
    the second semiconductor chip includes a plurality of second electrodes and a plurality of second oxide films formed on side surfaces of the plurality of second electrodes, respectively,
    a plurality of switches is provided,
    film thicknesses of the first oxide films are different from each other,
    film thicknesses of the second oxide films are different from each other, and
    the first semiconductor chip and the second semiconductor chip are electrically connected with each other through any one of the plurality of switches.

3. The semiconductor device according to claim 1, wherein the core element expands when its temperature is raised, and contracts when its temperature drops.

4. The semiconductor device according to claim 1, wherein the core element contracts when its temperature is raised, and expands when its temperature drops.

5. The semiconductor device according to claim 1, wherein after the core element expands by the temperature change, the core element does not return to its original shape by a temperature change.

6. The semiconductor device according to claim 1, wherein after the core element contracts by the temperature change, the core element does not return to its original shape by a temperature change.

* * * * *